United States Patent [19] [11] 4,266,481
Garrett et al. [45] May 12, 1981

[54] IMAGE-BEARING LITHOGRAPHIC PLATES WITH DESENSITIZING COATING

[75] Inventors: Walter L. Garrett, Freeland; Ralph G. Czerepinski, Midland, both of Mich.

[73] Assignee: The Dow Chemical Company, Midland, Mich.

[21] Appl. No.: 53,634

[22] Filed: Jun. 29, 1979

Related U.S. Application Data

[60] Continuation of Ser. No. 888,889, Mar. 22, 1978, Pat. No. 4,200,688, which is a division of Ser. No. 763,262, Jan. 27, 1977, Pat. No. 4,186,250, which is a continuation-in-part of Ser. No. 586,455, Jun. 12, 1975, abandoned, which is a continuation-in-part of Ser. No. 565,915, Apr. 7, 1975, abandoned.

[51] Int. Cl.[3] .......................... B41N 1/00; B41N 3/00; G03F 7/02

[52] U.S. Cl. .................................... 101/456; 101/457; 101/465; 430/302; 430/309; 430/424; 430/444; 430/486

[58] Field of Search .................. 260/29.6 TA, 29.6 H, 260/29.6 MP, 29.6 WB; 430/302, 309, 424, 444, 486; 525/242; 101/456, 457, 465, 463.1; 106/2

[56] References Cited

U.S. PATENT DOCUMENTS

| | | | |
|---|---|---|---|
| 3,019,105 | 1/1962 | Adams | 430/302 |
| 3,136,636 | 6/1964 | Dowdall et al. | 430/160 |
| 3,211,686 | 10/1965 | Uber et al. | 260/29.6 |
| 3,265,504 | 8/1966 | Leonard et al. | 430/274 |
| 3,276,360 | 10/1966 | Stimson et al. | 101/463.1 |
| 3,374,094 | 3/1968 | Wainer | 430/282 |
| 3,594,289 | 7/1971 | Watkinson et al. | 204/38 A |
| 3,669,668 | 6/1972 | Watkinson et al. | 430/277 |
| 3,733,200 | 5/1973 | Takaishi et al. | 101/457 |
| 3,738,850 | 6/1973 | Radell et al. | 106/2 |
| 4,033,919 | 6/1977 | Lawson | 260/29.6 TA |

*Primary Examiner*—Edward C. Kimlin

[57] ABSTRACT

Aqueous solutions are provided for treating image-bearing lithographic plates. These solutions include as an active polymer component:

(a) a polyacrylamide-based polymer wherein from about 3 to about 70 percent of the carbonyl sites are carboxyl groups, and the balance of said sites are amide moieties;

(b) a physical blend comprised of from about 97 to about 30 weight percent polyacrylamide and from about 3 to about 70 weight percent polyacrylic acid or an alkali metal or ammonium salt thereof;

(c) a physical blend comprised of polyacrylamide, or polyacrylic acid or an alkali metal or ammonium salt thereof, and at least one polyacrylamide-based polymer as described in (a), said polymers being employed in proportions such that of the total carbonyl sites present in the blend, from about 3 to about 70 weight percent are carboxyl groups and the balance are amide moieties;

(d) a mixture of any two or more of the foregoing; or (e) a mixture of any one or more of the foregoing with up to about 30 percent by weight hydroxypropyl methylcellulose.

The weight average molecular weight ($M_w$) of each of the polyacrylamide-based polymer, the polyacrylamide, and the polyacrylic acid or salt thereof is from about 10,000 to about 500,000.

By employing various concentrations of the above described active component in an aqueous solution, and, optionally, by employing in addition other components, solutions and/or emulsions are provided for the developing, gumming, gum etching, cleaning, storage, and the like, of lithographic plates. The method consists in applying the compositions to an image-bearing plate. As a new article, there is produced a lithographic plate bearing an image and having a coating containing the recited active polymer component.

10 Claims, No Drawings

IMAGE-BEARING LITHOGRAPHIC PLATES WITH DESENSITIZING COATING

CROSS-REFERENCE TO RELATED APPLICATION

This application is a Continuation of copending application Ser No. 888,889, filed Mar. 22, 1978, now U.S. Pat. No. 4,200,688, which is a division of application Ser. No. 763,262, filed Jan. 27, 1977, now U.S. Pat. No. 4,186,250, which is a Continuation-in-Part of application Ser. No. 586,455, filed June 12, 1975, now abandoned, which is a Continuation-in-Part of application Ser. No. 565,915, filed Apr. 7, 1975, now abandoned.

BACKGROUND OF THE INVENTION

The invention relates to methods of developing, gumming, gum etching, dampening during printing, cleaning during and after printing, and treatment before storage, of lithographic printing plates, and to compositions therefor which utilize polyacrylamide polymers and blends thereof in place of or as an extender for the traditional gum arabic. The invention also relates to the treated lithographic plates.

DESCRIPTION OF THE PRIOR ART

Lithographic printing, which is a type of planographic printing, is a well-known and established art. In general, the process involves printing from a flat plate or cylinder having substantially no surface relief (hence, the term "planographic"), and depends upon different properties of the image and non-image areas of the surface for printability. In lithography, the image to be reproduced is imparted to the plate by any one of several methods well-known to those skilled in the art in such a way that the non-image areas are rendered hydrophilic while the image areas are hydrophobic. A widely practiced technique employs a photosensitive coating for this purpose. Following exposure of the photosensitive coating to imagewise modulated light, the latent image is developed and a portion of the coating is removed from the plate. Next, the plate is treated with a desensitizing solution to render the plate hydrophilic in the areas from which the photosensitive coating has been removed. During the actual printing process, an aqueous fountain solution is applied to the plate surface. The fountain solution keeps moist all portions of the surface not covered by the hydrophobic image. Furthermore, the fountain solution prevents the plate from scumming, i.e., it prevents the non-image areas from becoming at least partially ink-receptive. The fountain solution may be formulated to gradually etch the surface of the plate just enough to keep the lines sharp and prevent rapid wear. In a conventional system, the fountain solution is applied to the plate by one or more rollers. At least one ink roller coated with an oil-based printing ink then contacts the entire surface of the plate but deposits the lithographic ink only on the image area since the hydrophilic non-image areas repel the ink. Hence, for each impression made during a run, the lithographic plate is first dampened with the aqueous fountain solution and then inked with a lithographic ink. Alternatively, the fountain solution and at least a portion of the oil-based ink are applied to the plate simultaneously with a first roller. In this latter system, other rollers, usually smaller in diameter than the first, may contact the plate subsequently to distribute the ink more evenly. Finally, the ink image is transferred directly to a paper sheet or other receptive surface to be printed, or to an offset blanket of rubber or synthetic material which in turn transfers the print to the final copy surface.

Gum arabic has long been used in acidic aqueous solutions in the preparation of lithographic plates. Gum arabic has been used, for example, in solutions for developing a latent image; as a desensitizing ingredient in a gumming solution—sometimes in combination with an etchant, in which case the solution is referred to as a gum etch—to make the non-image areas sharply defined and ink repellent, i.e., hydrophilic rather than hydrophobic; in a fountain solution, again sometimes in combination with an etchant, to keep the non-image areas hydrophilic during the press run; as a protective coating during idle periods on the press or even during storage for weeks and months; and in plate cleaner formulations.

Gum arabic is a natural product obtained as an exudate from acacia trees. While the precise structure of gum arabic is not known, the main constituent apparently lies somewhere between hemi-cellulose and the simple sugars. Essentially, it is a mixture of calcium, magnesium, and potassium salts of arabic acid. The average molecular weight of the polymerized arabic acid is in the range of 200,000 to 270,000.

The disadvantages of gum arabic are well recognized in the trade and a suitable substitute has long been sought. As a natural product, it is subject to considerable variation in quality, and it is also prone to contain foreign matter of various kinds so that it must first be purified. The fountain solutions of gum arabic employed during printing to maintain the non-printing areas hydrophilic tend to emulsify the ink. Excessive emulsification weakens the resolution of the printing, causes scumming of the plate, and stripping of the ink from the ink rollers. In addition to the technological shortcomings of gum arabic, the continued assured availability of an adequate supply of the product in the United States is in doubt, since nearly all of the domestic supply is imported from the politically unstable Middle East. U.S. Department of Commerce data projects that for 1975, the quantity of gum arabic imported will be only about one-half that imported in 1972, and the unit price has more than doubled in the same period. Thus, a substitute for gum arabic is urgently needed.

Some of the compositions heretofore proposed as gum arabic substitutes for the treatment of image-bearing plates include oxalic acid (U.S. Pat. No. 3,489,561), homopolymers and copolymers of itaconic acid (U.S. Pat. No. 3,507,647), sodium carboxymethylcellulose (U.S. Pat. No. 3,166,421), the copolymer of methyl vinyl ether and maleic anhydride (ibid.), polyacrylic acid (U.S. Pat. No. 3,211,686) and the sodium and ammonium salts thereof (Japanese Patent Publication No. 49-6561 (1974)), alginic acid and the sodium salt thereof, and polyvinyl alcohol (U.S. Pat. No. 3,607,255). None of these proposed substitutes seems to have realized overwhelming commercial acceptance, at least to this date, as gum arabic continues to be the composition of choice in industry, notwithstanding all of its disadvantages.

Recently, alkaline solutions have been proposed and used with some success as fountain solutions. However, most contain a considerable proportion of surfactants, have a tendency to foam, and cause some emulsification of the ink. Consequently, they are not always suitable.

British Patent No. 1,055,711 teaches an improved silver halide diffusion transfer process using a light sensitive material comprising a silver halide emulsion layer covered with a water-soluble colloid top layer. The light sensitive material is exposed, developed, and only then brought in contact with the metal comprising the lithographic plate, for transfer of the image to the plate. Included in the list of colloids taught to be suitable for use in the top layer are polyacrylamide and polyacrylic acid. It is also taught that the top layer may contain more than one of the colloids named in the list. However, the patent contains no suggestion to use polyacrylamide or polyacrylic acid—either separately or together—to render hydrophilic the non-image area of the plate once the image has been transferred to the plate: for that purpose, the patentees use carboxymethyl-cellulose. Indeed, the patent contemplates the disappearance of the colloid of the top layer after the transfer is carried out. Moreover, the patent teaches no preference for mixtures of polyacrylamide and polyacrylic acid over the respective compounds employed separately, thereby suggesting that in the process there described, no particular advantage is obtained by employing the compounds in admixture. In contrast, in the herein described processes for treating lithographic plates already having an image, it has been found to be critical to employ an active polymer component having the proper ratio of both amide and carboxyl groups as illustrated by the numerous Examples and Comparative Runs hereinafter set forth. Also, the weight average molecular weight of the active polymer component is critical in the present process.

In addition, the art contains several suggestions to employ polyacrylic acid-containing or polyacrylamide-containing compositions in various ways as more or less permanent components of the lithographic plate itself, i.e., in compositions which form part of the plate even before the plate contains an image. For example, Leonard et al., U.S. Pat. No. 3,265,504, apply a permanent polyacrylamide-containing coating on the entire surface of the plate by contacting the plate with an abrasive polyacrylamide-containing slurry while simultaneously mechanically brush graining the surface. Dowdall et al., U.S. Pat. No. 3,136,636, employ polyacrylic acid or water-soluble homologs thereof in a stratum between the surface of the plate and the diazo coating. Similar teachings are found in several other U.S. Patents such as No. 3,298,852. In U.S. Pat. No. 3,374,094, Wainer et al. describe a binder for the photosensitive composition for a lithographic plate, the binder containing any of a number of hydrophilic colloids, including polyacrylamide. No attempt has been made, however, so far as the Applicants are aware, to utilize polyacrylamide compositions for the treatment of lithographic plates already having an image (latent or developed) thereon, for example, in desensitizing or fountain solutions.

DEFINITION OF TERMS

The term "image" includes (1) both the hydrophobic, oleophilic, ink receptive areas of a lithographic plate produced, for example, on development of a photolithographic plate following exposure to actinic light, and also (2) the latent image produced in the light sensitive coating of such a photolithographic plate after exposure of the plate to actinic light but prior to development.

The term "non-image" refers to hydrophilic, oleophobic, water receptive, ink repelling areas of a lithographic printing plate.

By "image-bearing surface" is meant the entire surface of the lithographic plate exposed to the paper or the blanket in the printing process, including both the image and non-image areas as hereinabove defined.

"Scumming" refers to the condition that exists on the printing plate or results in the printed image when the water receptive areas of the printing plate become at least partially ink receptive.

The term "blinding" refers to the condition that exists on the printing plate or results in the printed image when the image areas of the printing plate become at least partially water receptive and are not properly ink receptive, e.g., the condition that is exhibited when hydrophilic material from the fountain solution adheres to the plate image instead of or in addition to the non-image areas.

"Toning" or "tinting" refers to emulsification of the ink as globules in water in the non-image areas which results in ink transfer to the print in non-image areas.

"Desensitization" refers to the depositing in the non-image areas of an adequate protective film of a hydrophilic substance to prevent the plate from picking up ink in such areas from the inking roller during printing, or, during screening tests, from retaining ink from a sponge or a tissue wiped across the plate surface.

The term "chromium-anion providing agent" refers to one or more compounds selected from the group consisting of chromic acid and the alkali metal- and ammonium-chromates and bichromates.

It is very difficult if not virtually impossible to have an aqueous solution of polyacrylamide wherein all of the carbonyl sites are amide moieties. The term "polyacrylamide" therefore refers to a polymer comprised of at least 98 percent

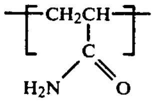

combining units. Included within the meaning of polyacrylamide are polymers containing 98 percent of the above combining units, and up to 2 percent

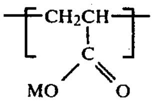

combining units wherein M is a hydrogen, alkali metal, or ammonium ion.

The terms "active polymer(s)" and "active polymer-component(s)" mean in a generic sense any one or more of the members (a) through (c) of the Markush group further defined in the following section, "Summary of the Invention".

The term "carboxyl group(s)" refers to the moiety

wherein M is a hydrogen, alkali metal, or ammonium ion.

The term "alcohol", used in reference to the fountain solutions of the present invention, refers generically to lower alkali mono- and polyhydric alcohols and glycol ethers having a molecular weight of about 170 or less.

By "lower alkyl" is meant having no more than four consecutive carbon atoms.

The abbreviations "cP" refers to the viscosity unit, centipoise. Unless otherwise specified and except for the viscosity measurements relating to characterization of the hydroxypropyl methylcellulose, all viscosity measurements were made at ambient temperatures using a Brookfield viscometer. Spindle sizes of 1 through 4 were employed at rotations of from 6 to 60 revolutions per minute, as appropriate for each particular solution.

SUMMARY OF THE INVENTION

It has now been discovered that a highly satisfactory composition for rendering hydrophilic the non-image areas of a lithographic plate comprises: water and a member of the group consisting of:

(a) a polyacrylamide-based polymer wherein from about 3 to about 70 percent of the carbonyl sites are carboxyl groups, and the balance of said sites are amide moieties;

(b) a physical blend comprised of from about 97 to about 30 weight percent polyacrylamide and from about 3 to about 70 percent polyacrylic acid or an alkali metal or ammonium salt thereof;

(c) a physical blend comprised of polyacrylamide, or polyacrylic acid or an alkali metal or ammonium salt thereof, and at least one polyacrylamide-based polymer as described in (a), said polymers being employed in proportions such that of the total carbonyl sites present in the blend, from about 3 to about 70 percent are carboxyl groups and the balance are amide moieties;

(d) a mixture of any two or more of the foregoing; the weight average molecular weight of each of said polyacrylamide-based polymer, polyacrylamide, and polyacrylic acid or salt thereof being in the range of from about 10,000 to about 500,000; and (e) a co-mixture of one or more of the foregoing with up to about 30 weight percent hydroxypropyl methylcellulose based on the total weight of the co-mixture, said hydroxypropyl methylcellulose being of a type which produces a 2 weight percent aqueous solution having a viscosity of from about 1 to about 100 cP when measured according to ASTM Method D 2363-72.

In the method of this invention, the foregoing composition is applied to an image-bearing lithographic plate to render hydrophilic the non-image areas, in aqueous solutions of different concentrations, optionally in combination with other components, depending on the particular function desired. Thus, a very dilute solution, e.g., 0.001–0.5 weight percent active polymer, can be employed as a fountain solution, whereas a more concentrated solution, e.g., 3–30 weight percent active polymer can be employed where the plate is to be desensitized initially, cleaned, or prepared for storage. The method encompasses application of the solution to a plate manually or by automated means. The composition is used either in an acid solution, in which case it may be regarded as a substitute or extender for gum arabic, in a solution of neutral pH, or in the more recently developed lithographic plate treatment solutions of the alkaline type. Aqueous solutions containing the active polymer can also be employed as one phase of emulsions for developing a latent image in an exposed photosensitive coating on a lithographic plate, and for reconditioning a plate after extended use. Concentrated aqueous solutions comprising the active polymer component can be readily stored and/or transported and then diluted with water when needed for actual use. An image-bearing lithographic printing plate having at least a partial coating comprising the active polymer is also regarded as an aspect of this invention.

DETAILED DESCRIPTION OF THE INVENTION

The method of the present invention is preferably practiced using ball grained, brush grained, or anodized aluminum plates. The invention can also be practiced, however, using copperized aluminum plates or trimetal chromium/copper/aluminum plates, as well as offset master plates of steel, aluminum, or those having zinc oxide/resin binder or titanium dioxide/resin binder surfaces.

The Active Polymer:

At the heart of all aspects of this invention is the active polymer component.

The active polymer component may be a polyacrylamide-based polymer wherein from about 3 to about 70 percent of the carbonyl sites are carboxyl groups and the balance are amide moieties. The particular method by which the polyacrylamide-based polymer is prepared is not critical. It may be formed by copolymerization of acrylamide and acrylic acid, or salts thereof, in proportions and conditions such that of the carbonyl sites in the resulting copolymer, from about 3 to about 70 percent are carboxyl groups. Alternatively, a suitable polyacrylamide-based polymer may be obtained by hydrolysis of polyacrylamide. The preparation of both partially hydrolyzed polyacrylamide and copolymers of polyacrylic acid and acrylamide are well-known in the art. See, generally, "Acrylamide Polymers" *Encyclopedia of Polymer Science and Technology,* Volume I, pp. 177ff, Interscience Publishers, N.Y., 1964.

The active polymer component need not be a single polymeric substance, so long as the number of carboxyl groups present in the entire active polymer component constitutes from about 3 to about 70 percent, preferably about 5 to about 50 percent, and most preferably about 5 to about 25 percent, of the total carbonyl sites, i.e., of the sum of the carboxyl groups and amide moieties. Thus, the active polymer component can be a physical blend of polyacrylamide and polyacrylic acid, including the alkali metal and ammonium salts thereof; or a physical blend of polyacrylamide with a polyacrylamide-based polymer of the type described in the preceding paragraph; or any other mixture of polyacrylamide, polyacrylic acid and the alkali metal and ammonium salts thereof, and polyacrylamide-based polymers, so long as the required percentage of carbonyl sites are present as carboxyl groups.

An additional requirement is that each of the polyacrylamide, the polyacrylic acid or salt thereof, and the polyacrylamide-based polymers employed in the solution must have a weight average molecular weight of from about 10,000 to about 50,000, and most preferably from about 25,000 to about 300,000. As a guide to those practicing this invention, the weight average molecular weight of the polymers and the percentage of carbonyl sites as carboxyl groups should be considered together: although the minimum acceptable percentage of carboxyl groups does not appear to vary significantly with molecular weight, the maximum percentage of carboxyl groups at which satisfactory results are obtained generally declines with increasing weight average molecular weight.

Finally, the active polymer component may be a co-mixture of any of the polyacrylamide-based polymers or physical blends hereinabove described, with up to about 30 weight percent hydroxypropyl methylcellulose, preferably from about 10 to about 25 weight percent. In a typical process for the manufacture of hydroxypropyl methylcellulose, cellulose is reacted with propylene oxide and methyl chloride in the presence of sodium hydroxide to obtain hydroxypropyl substitution on the anhydroglucose units. Hydroxypropyl methylcellulose is a solid at room temperature, but is known and commercially available in a variety of types which produce 2 weight percent solutions having viscosities of up to at least about 75,000 cP when measured at 20° C. according to ASTM Method D 2363-72. The type suitable for use herein produces a 2 weight percent solution having a viscosity of from about 1 cP to about 100 cP when measured according to said Method.

SOLUTIONS CONTAINING THE ACTIVE POLYMER AND THEIR USE

Having thus described the various forms which the active polymer component may take, solutions containing the active polymer component formulated to accomplish a particular function will now be described. It is to be understood, of course, that while a particular formulation may have another primary function, such as developing a latent image in an exposed photosensitive coating, the active polymer component of such a formulation is employed to render hydrophilic the non-image areas of an image-bearing plate.

DEVELOPER FORMULATION

The active polymers of the present invention can be used in the aqueous phase of emulsion type formulations employed to develop a latent image on an exposed photolithographic plate.

In the preparation of a photolithographic plate, a plate having a photosensitive coating is exposed to imagewise modulated light. For example, the plate can be exposed to actinic light through an image-bearing transparency, whereby light and shadow areas are cast upon the plate. The photosensitive coating may be of a positive working type, wherein the areas of the coating exposed to light are to be removed from the plate while the shadowed portions of the coating remain adhered to the plate. More frequently, a negative working sensitive coating is employed, wherein the portions of the coating exposed adhere to the plate and become the oleophilic areas of the plate. Representative of the negative working coating are those of the diazo and polyvinyl cinnamate types.

Regardless of the particular type of photosensitive coating employed, the plate is treated with a developer solution after exposure. While a variety of formulations are employed as developers depending on the particular type of photosensitive coating employed, most comprise an emulsion containing at least one water-immiscible solvent for selectively removing the photosensitized coating from only those areas of the plate which are not intended to carry the printing ink. Thus, where a negative working photosensitive composition is employed, the solvent removes the shadowed areas of the coating, leaving intact those areas which were actually exposed to light. Conversely, where the plate has a positive working coating, the developer formulation contains a solvent which removes the coating from the exposed area, leaving the shadowed areas intact. A second phase of the developer emulsion comprises an aqueous solution containing an agent for rendering hydrophilic the non-image areas of the plate. The active polymers of the present invention can be employed in the aqueous phase of virtually any of such developer formulations in lieu of, or in partial substitution for, the agents heretofore employed for this purpose, such as gum arabic. Since the particular constituents employed in various developer formulations do vary somewhat, however, it is recommended that prior to preparing a large batch employing the active polymer, the compatibility of the active polymer with the remaining constituents be confirmed. When so employed, the active polymer component comprises from about 0.1 to about 5 weight percent of the aqueous phase of the emulsion, and the aqueous phase comprises from about 5 to about 75 percent of the total emulsion, by volume.

In addition to the water-immiscible selective solvent and the aqueous phase containing an active polymer as hereinabove described, the developer emulsion may also contain an agent such as a dye or pigment for rendering easily visible the oleophilic areas of the plate. Also frequently employed in developers are agents for enhancing the properties of the oleophilic areas of the plate, either with respect to durability, oleophilicity, or both. The aqueous solutions of the present invention are compatible for use with any of these optional components as well.

The inclusion in the developer of an agent for rendering hydrophilic the non-image areas is not intended to supplant use of a separate so-called "straight gum" or "gum etch" solution, or substitute, for desensitizing the plate as hereinafter described. It does, however, provide protection against plate sensitization caused, for example, by oxidation during the time between the exposure and a subsequent desensitizing step.

SO-CALLED "STRAIGHT-GUM" SOLUTIONS

One type of aqueous solution referred to in the trade as a "gum" or "straight gum" solution consists essentially of water and a hydrophilic colloid. A widely used straight gum solution is 14° Baumé (approximately 25 percent) gum arabic. Such a solution naturally has a pH of from about 4 to about 5. This type of solution can be used to densensitize a plate after the plate has been exposed and developed, or after the plate has been cleaned with a plate cleaning etch containing no hydrophilic colloid. It can also be used to treat a plate for storage.

A solution is now provided according to the present invention to be used for substantially the same purposes as a conventional straight gum solution, comprising water and from about 3 to about 30 weight percent an active polymer. Such a solution is approximately of neutral pH, but may be slightly acidified with, for example, hydrochloric, phosphoric, or sulfuric acid, if desired. A slightly basic straight gum type solution may be prepared by including an alkali metal or ammonium phosphate. A straight gum solution of the present invention is generally characterized by a pH within the range of from at least about 3 to about 9; similar solutions having a pH either above or below the stated range are generally regarded as "gum etch" solutions, hereinafter described.

The amount of active polymer component employed in solutions used as a substitute for a straight gum solution depends in part upon the weight average molecular weight of the polymers employed. Those skilled in the art will recognize that within the above range of from about 3 to about 30 weight percent, the quantity of a particular active polymer component employed should be such that the viscosity of the solution is from about 4 to about 1,000 cP, and preferably from about 50 to about 300 cP, in order to obtain a uniform film on the plate. Where the active polymer component employed is among those described above as preferred, i.e., with respect to molecular weight, percent carbonyl sites as carboxyl groups, and the like, a preferred active polymer concentration range for a solution to be used in lieu of a conventional straight gum solution is from about 5 to about 12 weight percent. Thus, in most instances, the preferred amount of active polymer component employed is less than half the amount by weight of gum arabic formerly used.

SO-CALLED "GUM ETCH" SOLUTION

Another type of solution, known in the art as a "gum etch" solution, typically comprises 32 parts by weight of a straight gum solution, as hereinabove described, per part of 85 percent phosphoric acid. Such a solution is employed, for example, in lieu of a straight gum solution to desensitize a plate after the plate has been exposed and developed, or to desensitize a plate after the plate has been cleaned, or to apply a protective coating prior to storage. The distinction between a straight gum solution and a gum etch solution is that the latter can also be used to clean a scummed plate, in which case the two-step procedure of cleaning and thereafter regumming can be reduced to one step.

Both acidic and alkaline substitutes for a conventional gum etch solution are provided by the present invention. Each comprises from about 3 to about 30 weight percent active polymer component and from about 2 to about 4 weight percent (anhydrous basis) of a compound selected from the group consisting of (1) alkali metal and ammonium phosphates and mixtures thereof and (2) phosphoric acid. The acidic gum etch type solution contains phosphoric acid and is characterized by a pH of from about 1 to about 3, whereas the alkaline gum etch type solution contains at least one alkali metal or ammonium phosphate and is characterized by a pH of from at least about 9 to about 12.5.

With respect to both the acidic and the alkaline solutions, a solution which has a pH which is too neutral will not etch the plate sufficiently rapidly to be of any practical use as a cleaning solution, though of course such a solution can be employed as a straight gum type solution, i.e., merely to desensitize a plate rather than to clean or etch the plate. On the other hand, solutions which are too acidic or too basic etch the plate too rapidly, so that portions of the image areas of the plate are destroyed or weakened.

The teachings presented above in describing the substitute for conventional straight gum solutions with respect to solution viscosity and preferred concentrations, are applicable to solutions which are substitutes for conventional gum etch solutions as well. Thus, a preferred active polymer component is preferably employed in a concentration of about 5–12 weight percent of the solution.

As a concentrate, an aqueous solution is provided comprising active polymer component, and phosphoric acid or alkali metal or ammonium phosphates, in proportions so that upon dilution with additional water, a solution is obtained containing said compounds in the amounts hereinabove described as required for the gum etch type solution of this invention.

FOUNTAIN SOLUTIONS

Another category of solution required in lithographic printing is a fountain solution. Normally, a plate will have been desensitized with a straight gum or gum etch type solution, or a substitute as provided herein, before a press run is begun. A fountain solution contains water to moisten the hydrophilic areas of the plate, and just enough selected additional ingredients to keep the non-image areas of the plate well defined and hydrophilic throughout the press run. On a very short press run, water alone is sufficient since the initially desensitized plate will remain desensitized for at least a few printing cycles. As a practical matter, however, fountain solutions also contain, at the minimum, an agent for maintaining the hydrophilicity of the non-image areas. Thus, for example, a straight gum solution can be diluted and used as a fountain solution. Often, a fountain solution contains in addition phosphoric acid. Hence, an acidic gum etch type solution can also be diluted to provide a fountain solution. Where an acid fountain solution having a pH of from about 3.5 to about 5.5 is employed, a solution regarded as preferred in the art usually contains a metal nitrate salt, phosphoric acid, and sometimes a chromiun-anion providing agent.

The present invention embraces generally four types of fountain solutions, grouped according to the pH of the solution and the nature of the solvent system: acidic aqueous, alkaline aqueous, acidic water/alcohol, and alkaline water/alcohol. Each of the four types comprises, by weight, at least about 97 percent solvent and from about 0.001 to about 0.5 percent, preferably from about 0.0025 to about 0.1 percent, active polymer. Insufficient active polymer results in inadequate protection of the plate during long press runs, while an excess can result in an inordinate build-up of a glaze on the rollers.

The solvent comprises at least about 75 volume percent water. In the case of acidic aqueous and alkaline aqueous fountain solutions, the solvent consists essentially of water.

It is known in the art, however, that it is sometimes desirable to include an alcohol in the fountain solution, particularly when printing on high quality coated stock, for example, when using a Dahlgren type dampening system. One advantage of an alcohol is that it changes the wetting angle so that the fountain solution can be carried from the fountain reservoir to the plate surface on rollers of metal, rubber or the like, having no water absorbent wrapping, such as cloth or paper. The fountain solutions of this invention having a water/alcohol solvent system are similar in all respects to the corresponding aqueous fountain solutions, except that an equal amount, by volume, of a low molecular weight (about 170 or less) lower alkyl mono- or polyhydric alcohol or glycol ether is employed in lieu of up to about 25 volume percent of the water. Examples of such compounds are isopropanol, propylene glycol, glycerine, and diethylene glycol ethyl ether. Depending on the nature and concentration of the active polymer component and the compound selected for use as a solvent in lieu of some of the water, those skilled in the art will recognize that in some instances the water:alcohol ratio must be greater, i.e., more water, than 75:25 lest precipitation of the active polymer component occur. Usually, of course, no more alcohol will be employed than is required to achieve the performance desired, if for no other reason than cost. In this respect, an advantage of the acidic water/alcohol fountain solutions of the present invention is that a significantly lower proportion of alcohol is generally required to achieve a desired performance than in comparable fountain solutions based on gum arabic.

The acidic fountain solutions of this invention, regardless whether the solvent system consists of water or includes an alcohol, may contain, in addition to the active polymer: a metal nitrate in an amount up to about 0.25 weight percent of the solution, calculated on an anhydrous basis, preferably from about 0.02 to about 0.15 weight percent, and most preferably from about 0.04 to about 0.1 weight percent; phosphoric acid in an amount up to about 0.05 weight percent of the solution, preferably from about 0.004 to about 0.03 percent, and most preferably from about 0.008 to about 0.018 weight percent; and a chromiun-anion providing agent in an amount up to about 0.02 weight percent of the solution, calculated on an anhydrous basis, preferably from about 0.01 to about 0.02 percent. Ammonium bichromate is the preferred chromium-anion providing agent. Preferably, the pH of the acidic fountain solutions is maintained within the range of from about 3.5 to about 5.5.

Metal nitrates suitable for use in the acidic fountain solutions described herein are those nitrates, the corresponding hydroxide compound of which, e.g., $Mg(OH)_2$, has a solubility product in water at 25° C. of from about $10^{-5}$ to about $10^{-35}$, and preferably from about $10^{-10}$ to about $10^{-20}$. Included by way of example are the nitrates of magnesium, calcium, cadmium, beryllium, aluminum, tin, zirconium, nickel, manganese, iron ($Fe^{+2}$ only), chromium, copper, and lead. Preferably, the metal has a standard reduction potential negative with respect to hydrogen. Magnesium and zinc nitrates are most preferred. Those skilled in the art will recognize that where some of the aforementioned metal nitrates are employed, within the above limits, the concentrations of the various ingredients and the pH of the solution should be selected so that precipitation detrimental to the quality of the printed image or to the smooth operation of the press is avoided.

It has been found that when the acidic fountain solutions of the present invention are employed, less fountain solution is required to maintain the proper ink-water balance than when corresponding solutions of gum arabic are employed. When an insufficient supply of fountain solution is provided, the plate will not be moistened sufficiently, and scumming occurs. When too much moisture is applied, carry back of the fountain solution occurs on the ink rollers, which lends to uneven ink distribution on the rollers and on the plate. Since the use of less fountain solution ultimately results in less moisture being transferred from the plate to the surface being printed, faster press speeds are possible with fountain solutions of the present invention than with gum arabic fountain solutions. Moreover, there is less lint accumulation on the press rollers resulting in less frequent shut down for cleaning the press.

Finally, the alkaline fountain solutions employed herein have a pH of from about 7.5 to about 12, preferably from about 8.5 to about 10. In addition to the solvent and the active polymer, the alkaline fountain solutions contain sufficient alkali metal or ammonium phosphate or mixtures thereof to maintain the pH within a preselected range. Usually, this requires in the solution from about 0.01 to about 0.06 weight percent of the phosphate salt. Generally, the greater the quantity of active polymer employed in the solution, the lower the pH can be maintained with satisfactory results; however, by employing somewhat lower amounts of active polymer and operating at somewhat higher pH levels, the press can be restarted with fewer spoiled impressions following periods of brief shutdown, such as where a correction must be made on one of the plates on a four color press in the midst of a run. Since no surfactants of the type which have heretofore caused foaming in conventional alkaline fountains are required in the present invention, a preferred alkaline fountain solution consists essentially of water, the active polymer component, and the alkali metal or ammonium phosphate in proportions set forth above.

Concentrates of each of the four types of fountain solutions are provided for convenient transport and storage. These concentrates contain appropriate ingredients in the requisite amounts and proportions so that upon dilution of the concentrates with water, or with water and an alcohol, fountain solutions as described herein are obtained.

ASPHALTUM GUM EMULSION

When plates are employed in a long press run, or are reused in several runs of more moderate duration, the image areas sometimes tend to deteriorate. When this occurs, the practice in the art has been to treat the plate with an asphaltum gum emulsion comprised of from about 25 to about 75 percent by volume of aqueous phase, and the balance (exclusive of emulsion stabilizers) a water-immiscible phase containing asphaltum or other solid tar such as gilsonite, and a solvent therefor such as turpentine or a suitable mineral spirit, e.g., naphtha. The asphaltum (or equivalent) enhances the oleophilicity of the image areas of the plate and the aqueous phase, which includes a suitable agent for such purpose, simultaneously imparts a coating to the non-image areas to maintain and/or revitalize the hydrophilicity of such areas.

An asphaltum gum emulsion prepared according to the present invention comprises as the aqueous phase of an emulsion of the type just described, a solution containing from about 3 to about 30 weight percent, preferably about 5-15 percent, active polymer component, and up to about 4 percent, preferably about 2 to about 4 percent, phosphoric acid. When plates are treated with such an emulsion, impressions of premium quality can once again be obtained from the plates.

EXAMPLES AND COMPARATIVE RUNS

The following examples further illustrate the present invention, and in particular illustrate the use of solutions containing the hereinabove described polymers, copolymers, blends and co-mixtures for treating in various ways image-bearing lithographic plates. The examples are illustrative only and are not to be construed so as to limit the scope of the invention. In the tables, "Example" is abbreviated "Ex.", "Comparative Run" is abbreviated "C.R.", and all percents relating to solution concentrations are by weight unless otherwise specified.

A test procedure, hereinafter referred to as the "laboratory scumming test", was devised to evaluate the effectiveness of a composition as a desensitizing or gumming solution. Generally, if a composition adequately protects a plate against scumming in such a test, it will, as a rule, also perform adequately in any other plate treatment application, e.g., in a developer emulsion, in an asphaltum gum emulsion, or when diluted as a fountain solution. In the test, an exposed and developed plate was treated with the solution being evaluated, inked, rinsed with water, and examined for scumming, blinding, or tinting. In particular, brush grained aluminum sheets were coated with a diazo type photosensitive coating. Although the solutions of this invention can be employed with any diazo or other photosensitive coating, the particular diazo coating employed was formed by applying to the plate a solution made up by initially admixing two grams of "Wipe-On Coating Powder" with 56 grams "Negative Wipe-On Coating Solution", each of which was obtained as an item of commerce from RBP Chemical Corporation, Milwaukee, Wisc. After the diazo coating had sufficiently dried in warm air, the plate was exposed to a mercury arc 5 KW ultraviolet lamp at a distance of 38 inches (about 96.5 cm) through a 65-screen combination negative with half tones and line copy in a vacuum printer. The resulting latent image was developed and rinsed with water according to the manufacturer's directions using Sure Dot brand wipe-on developer, also obtained from RBP Chemical Corporation. An aqueous solution of the substance being evaluated was applied to at least a section of the wet plate with a paper tissue. In some runs, two or more substances were applied to different sections of the plate for simultaneous evaluation. The plate was buffed dry and maintained at ambient temperature for a duration of, in some runs one hour and in others 24 hours, 72 hours, 96 hours, or longer as hereinafter specified. The plate was then dampened with water and lightly buffed with a moist sponge after which a grease-based ink was applied and evenly distributed over the plate. Finally, the plate was rinsed with water and buffed with a wet sponge to remove ink from the non-image areas. The plate was examined under low power magnification for evidence of scumming, blinding, or tinting.

COMPARISON RUN 1

A 14° Baumé aqueous solution of gum arabic (equivalent to about 25 weight percent solids) having a pH of 4.7 and a viscosity of about 55 cP was evaluated using the laboratory scumming test. The non-image area of the treated plate was of good quality, showing no scumming after 72 hours.

EXAMPLES 1-3 AND COMPARISON RUN 2

Aqueous solutions of a polyacrylamide-based polymer having a weight average molecular weight of about 250,000, obtained by hydrolysis of approximately 10 percent of the carbonyl sites of a corresponding polyacrylamide polymer, were prepared and acidified with sulfuric acid as follows:

TABLE I

| Run | Percent Polyacrylamide-based Polymer | Solution Viscosity, Ambient Temperature | pH |
|---|---|---|---|
| Ex. 1 | 5 | 50 cP | 4.5 |
| Ex. 2 | 8.5 | 235 cP | 4.5 |
| Ex. 3 | 12 | 880 cP | 4.5 |
| C.R. 2 | 20 | 15,000 cP | 4.5 |

The solutions of Examples 1-3 were evaluated using the laboratory scumming test. In each instance, a sharp, clean image of excellent quality was obtained both on plates inked after one hour and after 72 hours. No scumming was observed in either line copy, solids, or half tones. The plates of Examples 1-3 were judged to be of even better overall quality than those obtained in Comparison Run 1 using gum arabic. The solution of Comparison Run 2 was found to be too viscous to spread uniformly over the plate at ambient temperature.

EXAMPLE 4

A 26 percent aqueous solution of a polyacrylamide-based polymer obtained by copolymerization of equal parts acrylamide and acrylic acid and having a weight average molecular weight of about 25,000 was prepared and the pH adjusted to 4.3 with sulfuric acid. The viscosity of the solution was measured as 120 cP. No scumming was observed in the laboratory scumming test when the plate was inked after 72 hours.

COMPARISON RUNS 3 AND 4

In Comparison Run 3, a 15 percent aqueous solution of polyacrylamide (less than 2 percent hydrolysis) having a weight average molecular weight of about 25,000 was prepared and the pH adjusted to 4.3. The viscosity of the solution was measured as 80 cP. Upon evaluation using the laboratory scumming test, scumming was observed when the plate was inked after 72 hours. Similarly, in Comparison Run 4, an 8 percent aqueous solution of polyacrylamide having a weight average molecular weight of about 250,000 was prepared and adjusted to pH 4.5. The solution had a viscosity of 190 cP, and did not adequately protect the plate against scumming in the laboratory scumming test. Comparison Runs 3 and 4 demonstrate that polyacrylamide alone having substantially no carboxyl groups at the carbonyl sites is not as effective in a gumming solution as either gum arabic or the compositions of the invention described herein and, therefore, is not commercially acceptable for such use.

COMPARISON RUNS 5 AND 6

In Comparison Run 5, a 0.4 percent aqueous solution having a pH adjusted to 4.5 and a viscosity of 215 cP was prepared from a polyacrylamide-based polymer having a weight average molecular weight somewhat in excess of about 1,000,000 and having carboxyl groups at about 30 percent of the carbonyl sites. The solution was evaluated using the laboratory scumming test. One hour after the solution was applied to the plate, it was found the plate inked readily, but some scumming was observed. More severe scumming was observed when a still higher weight average molecular weight (1.5 to $2\times10^6$) polymer was tested.

In Comparison Run 6, a series of solutions having a pH adjusted to about 4 and polymer concentrations ranging from about 6 to about 25 percent was prepared from polyacrylamide and polyacrylamide-based polymers having in each instance, weight average molecular weights less than about 5000. None of the compositions performed as well as gum arabic in the laboratory scumming test.

Comparison Runs 5 and 6 demonstrate that solutions based on polymers having a weight average molecular weight less than about 5000 or more than 1,000,000 are not as effective as gumming solutions containing similar polymers having weight average molecular weights within the above range and are not suitable for use as gum arabic substitutes.

EXAMPLES 5 AND 6

In Example 5, an 8 percent aqueous solution was prepared from a polyacrylamide-based polymer having a weight average molecular weight of from about 200,000 to about 250,000, and acidified to a pH of about 4.5 with sulfuric acid. The polymer had been prepared by copolymerization of acrylamide and acrylic acid using proportions such that about 10 percent of the carbonyl sites in the copolymer were carboxyl groups.

In Example 6, a similar solution was prepared from a polyacrylamide-based polymer having a weight average molecular weight of about 250,000, and approximately the same proportion of amide:carboxyl groups as in Example 5. The polymer in Example 6, however, was obtained not by copolymerization, but rather by hydrolysis of polyacrylamide.

Each solution was applied to two plates, according to the laboratory scumming test procedure. One pair of plates was inked after one hour, and the other was inked after 96 hours. None of the plates showed any scumming, thereby demonstrating that the method used to provide carboxyl groups in the active polymer component is not critical.

COMPARISON RUN 7

A solution was prepared as described in Examples 5 and 6, except that in lieu of the polyacrylamide-based polymer there was used unhydrolyzed polyacrylamide similar to that which had been hydrolyzed to produce the polymer used in Example 6. The solution proved unsatisfactory in the laboratory scumming test.

EXAMPLES 7-11 AND COMPARISON RUN 8

Example 7 shows the use of a solution containing 27 weight percent polyacrylamide-based polymer having a weight average molecular weight of about 25,000 obtained by copolymerization of equal parts acrylic acid and acrylamide. The pH of the solution was 4.5, and the viscosity was 65 cP. Aliquots of the solution of Example 7 were used as "Solution B" in preparing the various physical blends of Examples 8-11 as set forth in Table II. Used as "Solution A" for Examples 8-11 were aliquots of the solution used in Comparison Run 8, which is of substantially the same composition as the solution described hereinabove in Comparison Run 4, i.e., polyacrylamide having less than 2 percent hydrolysis.

TABLE II

| Run | Parts Soln. A/ Parts Soln. B | Percent Carbonyl sites as Carboxyl | Percent Total Polymer | Vis-cosity, cP | Polymer Weight Ave. M.W. $\times 10^3$ |
|---|---|---|---|---|---|
| C.R. 8 | 100/0 | 2 | 8 | 190 | 250 |
| Ex. 8 | 91.5/8.5 | 12 | 10 | 215 | 200 |
| Ex. 9 | 83.5/16.5 | 20 | 11 | 210 | 160 |
| Ex. 10 | 69.2/30.8 | 30 | 14 | 190 | 115 |
| Ex. 11 | 45.8/54.2 | 40 | 18 | 185 | 70 |
| Ex. 7 | 0/100 | 50 | 27 | 65 | 25 |

Plates were treated with each of the solutions described in Table II according to the laboratory scumming test procedure. When inked after seven days at ambient temperature and humidity, the plates of Examples 7-11 showed no scumming, while that of Comparison Run 8 showed severe scumming.

EXAMPLE 12

Another blend comparable to that described in Examples 8-11 was successfully employed in the same manner. The blend contained 4 weight percent each of polyacrylamide and partially (10 percent) hydrolyzed polyacrylamide, each having a weight average molecular weight of about 250,000. Thus, of the total carbonyl sites in the blend, about 5 percent were carboxyl groups. Solution viscosity was 120 cP.

EXAMPLE 13

A 4 percent solution of a polyacrylamide-based polymer having a weight average molecular weight of about 750,000 and about 20 percent of the carbonyl sites as carboxyl was prepared and acidified to pH 4.5. Viscosity of the solution was about 120 cP. Plates were treated and inked as per the laboratory scumming test. No scumming was observed on the plate when inked after 1 and 96 hour intervals. While certainly usable, the polymer solution was somewhat stringy and is not considered a preferred embodiment.

EXAMPLES 14-17

Aqueous solutions each containing approximately the same weight percent of polyacrylamide hydrolyzed to various degrees, were prepared and successfully employed in the laboratory scumming test. The solutions are summarized in Table III.

TABLE III

| Run | Percent Hydrolysis | Percent Active Polymer | Solution Viscosity | Polymer Wt. Ave. M. Wt. $\times 10^3$ |
|---|---|---|---|---|
| Ex. 14 | 8.7 | 7 | 105 | 250 |
| Ex. 15 | 14.2 | 7 | 110 | 250 |
| Ex. 16 | 19.5 | 7 | 115 | 250 |
| Ex. 17 | 28.9 | 7.5 | 155 | 250 |

EXAMPLES 18-20 AND COMPARISON RUNS 9 AND 10

The series of Examples and Comparison Runs included under this caption relate to the actual use in a lithographic printing process of solutions coming within the scope of the present invention. A separate Example or Comparison Run number has been designated for each solution employed. The solutions will be described first, followed by a description of their application.

The solutions shown in Table IV were prepared for use as straight gum type solutions. The gum arabic solution of Comparison Run 9 naturally has a pH of about 4.5. The solutions of Examples 8-20 were adjusted to their respective hydrogen ion concentrations using sulfuric acid.

TABLE IV

| Run | Active Ingredient | Polymer Wt. Ave. M. Wt. | Percent carbonyl sites as carboxyl groups | Percent Active Ingredient in Solution | Degrees Baume | Soln. Visc., cP | Soln. pH |
|---|---|---|---|---|---|---|---|
| Ex. 18 | Blend of partially hydrolyzed polyacrylamide, with a copolymer of equal parts acrylamide and acrylic acid | 150,000 | 22.8 | 10 | 5 | 150 | 4.4 |
| Ex. 19 | Partially hydrolyzed polyacrylamide | 250,000 | 12.3 | 8 | 4 | 140 | 4.4 |
| Ex. 20 | Partially hydrolyzed polyacrylamide | 250,000 | 23.2 | 7.4 | 4 | 140 | 4.5 |
| C.R. 9 | Gum Arabic | 240,000 | — | 25 | 14 | 60 | 4.5 |

Substitute solutions for conventional gum etch solutions, designated as Examples 18-GE, 19-GE, and 20-GE, respectively, were prepared by mixing 32 parts by weight of the respective gumming solutions of Examples 18, 19, and 20, with one part of 85 weight percent phosphoric acid. A control gum etch solution, Comparison Run 10, contained 32 parts of 7° Baumé gum arabic and one part of 85 weight percent phosphoric acid.

Four different fountain solutions, designated as Examples 18-F, 19-F, 20-F, and Comparison Run 9-F, were prepared by diluting to one gallon (3.78 liters): 1 fluid ounce (29.6 ml) of the respective desensitizing solutions of Examples 18–20 and Comparison Run 9, and 2 fluid ounces (59.1 ml) of a so-called etch concentrate. The particular etch concentrate employed was an aqueous solution consisting of (in addition to water), per liter, 90 grams of zinc nitrate and 8.5 ml of 85 weight percent phosphoric acid.

Having described the solutions employed, the press runs will now be described.

A series of latent images was established on a commercially available aluminum plate having a presensitized diazo coating by exposing the coating to an ultraviolet light source through a negative comprised of solids, 120 line screen, a screen step wedge, and a 40 percent tint scale. The plate was developed with the recommended chemicals for this commercial plate. The plate was divided into four parallel sections. To each of the four sections was applied a different desensitizing solution described above as Examples 18–20 and Comparison Run 9. The plate was maintained for 16 hours at ambient temperature and humidity and was then mounted on a Miehle Favorite litho press for scumming tests. To simulate varying rates of wear on the plates, paper packing of 0.008 inch, 0.0055 inch,, 0.004 inch, and 0.002 inch thicknesses was interposed between the plate and the plate roller in such a manner that the four sections of the plate which had been treated with four different desensitizing solutions would each be subjected to four different printing pressures. Thus, 16 different combinations of plate treatment and pressure were evaluated simultaneously. The dampening solution consisted only of water in order to provide a rigorous test for the desensitizing composition. The paper printed upon was Mountie brand Offset Enamel #70, sold by the Northwest Paper Company. The ink employed was Hanco Offset Super Max Arid Black BK 4644 Litho manufactured by Handschy Chemical Company. The test cycle was comprised of 10 cycles of inking and cleaning the plate with water, followed by the printing of 100 sheets. A total of 180 test cycles, each of 100 sheets, was run.

Scumming occurred throughout most of the press run in all of the sections of the plate under the excess pressure of the 0.008 inch packing, but after 180 test cycles, all the sections printed under normal press conditions (0.004 inch packing) were printing cleanly and showed no scumming. Similarly, substantially no difference was observed in the performance of the four desensitizing solutions in the portions of the plate having the 0.002 inch and 0.0055 inch paper packing. The sections of the plate treated with the solutions of Examples 18–20 were equivalent or better in print quality to that treated with the gum arabic solution of Comparison Run 9.

The portions of each of the four plate sections upon which scumming had developed were cleaned with the respective gum etch type solutions of Examples 18-GE through 20-GE and Comparison Run 10. The scum cleaned off with equal ease in all sections, and clean, high quality printed images were once again obtained from the plate, demonstrating that the active polymers of the present invention can be employed as a substitute for gum arabic in plate cleaning solutions.

Another test employing some of the same specific solutions hereinabove described under this caption was performed as follows. Four plates were exposed and developed in the same manner as described in the preceding press test. Each plate was desensitized using, in four parallel sections on the plate, the gum etch type solutions of Examples 18-Ge through 20-GE and Comparison Run 10. The four identically prepared plates were maintained under ambient conditions for 40 hours and each was then mounted on the press for successive runs. For each run a different one of the four fountain solutions of Examples 18-F through 20-F and Comparison Run 10 was employed. The pressure applied to different parts of the plates was again varied using different thicknesses of paper between the plate roller and the plate itself as hereinabove described.

On initial inking, the image areas in those portions of the plates desensitized with the substitute gum etch solutions of Examples 18-GE through 20-GE accepted ink more readily than those portions treated with the gum arabic counterpart, Comparison Run 10; i.e., there was less initial blinding with the compositions of the present invention. With each fountain solution, 5000 sheets were printed at a press speed of 4000 sheets per hour.

With the gum arabic fountain solution, satisfactory results were obtained in 15 of the 16 parts of the plate. In that portion of the plate which was desensitized with the gum arabic solution of Comparison Run 10 and which was subjected to the highest pressure during the press run, considerable scumming occurred in the half tones.

The fountain solutions of Examples performed in a manner comparable to one another, and each proved superior to the gum arabic fountain solution. Less fountain solution of the Examples were required to maintain the proper ink-water balance, and cleaner, better quality half tones were obtained, especially in the high pressure areas, than with the gum arabic fountain solution.

EXAMPLE 21

A fountain solution similar to that of Example 18-F was employed in a press run of 60,000 impressions on newspaper stock using a Harris Cottrell 15A web offset press. Prints of excellent quality were obtained throughout the run. No foaming of the fountain solution occurred, nor was there any indication that the ink was emulsified by the fountain solution. A suitable fountain solution may also be obtained by substituting, for example, an equal amount by volume of isopropyl alcohol, propylene glycol, glycerine, diethylene glycol ethyl ether, and the like, for up to about 25 percent of the water employed in solutions such as those described in Examples 18-F through 20-F. In particular, a press run of 60,000 impressions was made on a Harris Cottrell LTZ printing press using a fountain solution such as Example 18-F except that isopropanol was substituted for about 25 percent of the water.

EXAMPLES 22–27

Several alkaline concentrate and fountain solutions were prepared as summarized in Table V. The particular source of the active polymer component was an 8 percent aqueous solution of partially hydrolyzed (approximately 10 percent) polyacrylamide having a weight average molecular weight of about 250,000, although any of the polymers, copolymers, and blends hereinabove described may be used as well. The fountain solution of Example 26 was successfully employed in a press run of 300,000 impressions on newspaper stock. The fountain solutions of Examples 22–25 and 27 can be employed in a similar manner.

TABLE V

| | CONCENTRATE | | | | | FOUNTAIN | | |
|---|---|---|---|---|---|---|---|---|
| Example No. | Active Polymer Source Soln. | $Na_3PO_4 \cdot 12H_2O$ | $K_3PO_4$ | pH | Viscosity, cP | Quantity of Concentrate | Water Added | pH |
| 22 | | — | 3 g | 9.4 | 165 | | | 9.1 |
| 23 | | 1.5 g | 1.5 g | 9.3 | 160 | | | 9.0 |
| 24 | 100 g | — | 5 g | 10.4 | 190 | 1.5 fl. oz. (45 g) | 1 gallon (3785 g) | 9.7 |
| 25 | | 1.5 g | 2.5 g | 10.2 | 180 | | | 9.6 |
| 26 | | 7 g | — | 10.3 | 185 | | | 9.65 |
| 27 | | 9 g | — | 10.5 | 190 | | | 9.75 |

EXAMPLES 28–35 and Comparison Runs 11–14

Solutions containing a blend of hydroxypropyl methylcellulose ("HPMC" in the table which follows) and partially hydrolyzed (about 10 percent) polyacrylamide having a weight average molecular weight of about 250,000 were prepared, adjusted to a pH of 4.5 with sulfuric acid, and evaluated using the laboratory scumming test. Results are tabulated in Table VI.

TABLE VI

| Run | Type HPMC (Viscosity, cP of 2% Soln.) | Weight Ratio (Dry Basis) HPMC/Hydrolyzed (Polyacrylamide | SOLUTION Percent Active Polymer | SOLUTION Viscosity, cP | Remarks |
|---|---|---|---|---|---|
| Ex. 28 | 1.5 | 10/90 | 12 | 750 | Good; no scumming after 1 or 72 hours |
| Ex. 29 | 1.5 | 25/75 | 12 | 400 | Good; no. scumming after 1 or 72 hours |
| C.R. 11 | 1.5 | 50/50 | 12 | 150 | Unsatisfactory; scumming after 1 hour |
| C.R. 12 | 1.5 | 75/25 | 12 | 50 | Unsatisfactory; scumming after 1 hour |
| Ex. 30 | 1.5 | 10/90 | 6.5 | 32 | Satisfactory after 1 hour, scumming after 72 hours (viscosity somewhat low) |
| Ex. 31 | 1.5 | 25/75 | 6.5 | 35 | Satisfactory after 1 hour scumming after 72 hour (viscosity somewhat low) |
| C.R. 13 | 1.5 | 50/50 | 6.5 | 32 | Unsatisfactory; scumming after 1 hour |
| Ex. 32 | 2.5 | 25/75 | 6 | 50 | Good; no scumming after 1 or 72 hours |
| Ex. 33 | 2.5 | 25/75 | 10 | 220 | Good; no scumming after 1 or 72 hours |
| Ex. 34 | 50 | 10/90 | 5.7 | 72.5 | Good; no scumming after 1 or 72 hours |
| Ex. 35 | 50 | 25/75 | 5.7 | 104 | Good; no scumming after 1 or 72 hours |
| C.R. 14 | 50 | 40/60 | 5.7 | 170 | Unsatisfactory; scumming after 1 hour |

EXAMPLE 36

Fountain solutions containing hydroxypropyl methylcellulose are prepared in a manner similar to the fountain solutions described in Examples 18-F through 20-F by employing solutions such as those of Examples 28–35 in lieu of the solutions in Examples 18–20. As a specific example, 0.5 ounce (14.8 ml) of a solution such as that of Example 29, except containing 8 percent solids and having a viscosity of 165 cP, was admixed in 1 gallon (3.785 liters) of water with 1 fluid ounce (29.6 ml) of an etch concentrate comparable to that described in the preparation of Examples 18-F through 20-F, to form a fountain solution which was used in the printing of excellent quality prints of an ANPA Faximile Test Sheet on an offset press.

EXAMPLE 37

Another fountain solution is prepared by dissolving in 1 liter of water, about 4 milliliters of an "A" solution, hereinafter described, and about 8 milliliters of a "B" solution, also hereinafter described, and about 4 milliliters of the solutions of any of Examples 1–17, 18, 19, 20, and 28–35. The "A" solution comprises 1 liter of water, about 45 grams of ammonium bichromate, and about 24 ml of 85 percent phosphoric acid. The "B" solution comprises about 120 grams of magnesium or zinc nitrate dissolved in 1 liter of water.

EXAMPLE 38

A plate was treated as described in the laboratory scumming test with a solution such as that of Example 31, except containing 8 percent total active polymer component and having a solution viscosity of 165 cP. After storage for one month at ambient temperature and humidity, the plate was inked. No scumming was detected.

EXAMPLES 39–42

An "A" solution having a pH of 12.3 was prepared by dissolving 7 grams of $Na_3PO_4.12H_2O$ in 100 grams water. A "B" solution having a pH of 10.65 was prepared by dissolving 6 grams $Na_3PO_4.12H_2O$ in 100 grams of an aqueous solution initially adjusted to pH 4.5 and containing 6.5 weight percent partially (about 10 percent) hydrolyzed polyacrylamide having a weight average molecular weight of about 250,000. Four alkaline aqueous fountain concentrates were prepared by combining solutions "A" and "B" in different proportions as summarized in Table VII.

TABLE VII

| Run | Weight Ratio A/B | pH |
|---|---|---|
| Ex. 39 | 10/1 | 12.15 |
| Ex. 40 | 10/3 | 12.0 |
| Ex. 41 | 2/1 | 11.85 |
| Ex. 42 | 1/1 | 11.6 |

Sixteen fountain solutions were prepared by diluting 0.5 fluid ounce (14.8 ml), 1 ounce (29.6 ml), 2 ounces (59.1 ml), and 3 ounces (88.7 ml) of each of the four concentrates to 1 gallon (3.785 liters) with water. The pH of each of the resulting fountain solutions is shown in Table VIII.

TABLE VIII

| Source of Concentrate | Amount of Each Concentrate Diluted to One Gallon 0.5 oz. | 1 oz. | 2 oz. | 3 oz. |
|---|---|---|---|---|
| Ex. 39 | 11 | 11.35 | 11.6 | 11.73 |
| Ex. 40 | 10.87 | 11.28 | 11.55 | 11.65 |
| Ex. 41 | 10.7 | 11.15 | 11.45 | 11.55 |
| Ex. 42 | 10.58 | 11 | 11.28 | 11.38 |

EXAMPLE 43

An alkali solution comparable to that prepared as described in the preceding set of examples by diluting one ounce of the concentrate of Example 39 to one gallon was employed as the fountain solution throughout a press run of about 300,000 impressions on newspaper stock using a Harris Cottrell 15A web offset press. Impressions of high quality were obtained throughout the run, except for a small quantity of unsatisfactory impressions obtained immediately after periods of brief shutdown which is normal for alkaline fountain solutions. No significant foaming of the fountain solution was encountered during the run.

COMPARISON RUNS 15 and 16

In Example 2 of British Pat. No. 1,055,711, hereinabove discussed, an approximately 1 weight percent solution of medium viscosity polyacrylamide was employed to form the colloid top layer described therein. A 5 percent aqueous solution of the polyacrylamide of the type employed therein was taught to have a viscosity at 25° C. of between 280 and 600 cP.

For Comparison Run 15, a 5 weight percent aqueous solution of polyacrylamide was prepared, which had a viscosity of 355 cP at ambient temperature. The pH of the solution was 7.19. For Comparison Run 16, a portion of the solution of Comparison Run 15 was diluted with water to obtain a 1 weight percent solution. The latter had a viscosity of 15 cP and a pH of 7.15.

Two substantially identical image-bearing plates were treated according to the laboratory scumming test procedure with the respective compositions of Comparison Runs 15 and 16. To assure that any scumming which might be observed with the comparison compositions could not be attributed to defects in the plates or other extraneous factors, a third substantially identical image-bearing plate was treated with a composition which was substantially that of Example 6, i.e., an 8 weight percent solution of a polyacrylamide-based polymer having a carboxyl group at approximately 10 percent of the carbonyl sites. When inked 24 hours later, the plate treated with the 5 percent solution of Comparison Run 15 showed severe scumming, and that treated with the 1 percent solution of Comparison Run 16 was much worse still. That plate treated according to the present invention showed no evidence of scumming whatsoever.

Although the solution employed according to the present invention happened to be an 8 percent solution whereas those employed in the Comparison Runs were but 5 and 1 percent, that alone does not account for the remarkable difference in performance since as is described in Example 13, no scumming was observed, even after 96 hours, when a plate was treated with a 4 percent solution according to the present invention.

What is claimed is:

1. An image-bearing lithographic printing plate having in the form of a thin coating deposited from solution on the non-image areas of the plate a desensitizing material comprising an active polymer component selected from the group consisting of (a) a polyacrylamide-based polymer wherein from about 5 to about 70 percent of the carbonyl sites are carboxyl groups and the balance of said sites are amide moieties;

(b) a physical blend comprised of from about 95 to about 30 weight percent polyacrylamide and from about 5 to about 70 percent polyacrylic acid or an alkali metal or ammonium salt thereof;

(c) a physical blend comprised of polyacrylamide, or polyacrylic acid or an alkali metal or ammonium salt thereof, and at least one polyacrylamide-based polymer as described in (a), said polymers being employed in proportions such that of the total carbonyl sites present in the blend, from about 5 to about 70 percent are carboxyl groups and the balance are amide moieties;

(d) a mixture of any two or more of the foregoing (a)-(c); the weight average molecular weight of each of said polyacrylamide-based polymer, polyacrylamide, and polyacrylic acid or salt thereof being in the range of from about 10,000 to about 500,000; and (e) a co-mixture of one or more of the foregoing (a)-(d) with up to 30 weight percent hydroxypropyl methylcellulose based on the total weight of the co-mixture, said hydroxypropyl methylcellulose being of a type which produces a 2 weight percent solution having a viscosity of from about 1 to about 100 cP when measured according to ASTM Method D 2363-72.

2. The coated plate of claim 1 wherein the weight average molecular weight of each of the polyacrylamide-based polymer, the polyacrylamide, and/or the polyacrylic acid or salt thereof comprising the coating is in the range of from about 25,000 to about 300,000.

3. The coated plate of claim 2 in which the active polymer in the coating is the co-mixture of item (e) and hydroxypropyl methylcellulose comprises from about 10 to about 25 weight percent of the active polymer component.

4. The coated plate of claim 1 wherein of the carbonyl sites in the active polymer component, from about 5 to about 50 percent are carboxyl groups.

5. The coated plate of claim 4 wherein of the carbonyl sites, from about 5 to 25 percent are carboxyl groups.

6. The coated plate of claim 4 wherein the weight average molecular weight of each of the polyacrylamide-based polymer, the polyacrylamide, and/or the polyacrylic acid or salt thereof comprising the coating is in the range of from about 25,000 to about 300,000.

7. The coated plate of claim 4 wherein the active polymer component in the coating is the co-mixture of item (e), and hydroxypropyl methylcellulose comprises from about 10 to about 25 weight percent of the active polymer component.

8. The coated plate of claim 1 wherein the coating contains, in addition, one or more of: a compound selected from the group consisting of (1) phosphoric acid and (2) alkali metal phosphates and ammonium phosphates and mixtures thereof; a chromium-anion providing agent, or a metal nitrate, said metal nitrate being selected from those metal nitrates, the corresponding hydroxide compound of which has a solubility product in water of from about $10^{-5}$ to about $10^{-35}$.

9. The coated plate of claim 8 wherein the metal nitrate is magnesium or zinc nitrate, and wherein the chromiun-anion providing agent is ammonium bichromate.

10. The coated plate of claim 9 wherein of the carbonyl sites in the active polymer component, from about 5 to about 50 percent are carboxyl groups, and wherein the weight average molecular weight of each of the polyacrylamide-based polymer, the polyacrylamide, and/or the polyacrylic acid or salt thereof is within the range of from about 25,000 to about 300,000.

* * * * *

UNITED STATES PATENT AND TRADEMARK OFFICE
CERTIFICATE OF CORRECTION

PATENT NO. : 4,266,481

DATED : May 12, 1981

INVENTOR(S) : Walter L. Garrett et al.

It is certified that error appears in the above—identified patent and that said Letters Patent is hereby corrected as shown below:

Col. 6, line 61, delete "50,000" and insert --500,000--.

Col. 8, line 49, delete "densensitize" and insert --desensitize--.

Col. 10, line 30, delete "chromiun" and insert --chromium--.

Col. 11, line 22, delete "chromiun" and insert --chromium--.

Col. 11, line 55, delete "lends" and insert --leads--.

Col. 12, line 33, delete the word "of" and insert --an--.

Col. 14, line 66, insert --about-- before "1,000,000".

Col. 17, line 41, "coating by" should read -- coating, by-.

Col. 17, line 53, delete the second comma after the the word "inch", second instance.

Col. 17, line 66, delete "4644" and insert --4664--.

UNITED STATES PATENT AND TRADEMARK OFFICE
CERTIFICATE OF CORRECTION

PATENT NO. : 4,266,481

DATED : May 12, 1981

INVENTOR(S) : Walter L. Garrett et al.

It is certified that error appears in the above—identified patent and that said Letters Patent is hereby corrected as shown below:

Col. 18, line 47, delete "18-Ge" and insert --18-GE--.

Col. 19, line 5, insert the word --the-- before "Examples".

Col. 19, line 8, delete the word "were" and insert --was--.

Col. 19 and 20, Table VI, in the heading of the third column, delete the parenthesis before the word "Polyacrylamide".

Col. 22, line 46, delete "comparison" and insert --Comparison--.

Col. 24, Claim 9, line 3, delete "chromiun" and insert --chromium--.

Signed and Sealed this

*Thirteenth* Day of *October 1981*

[SEAL]

*Attest:*

GERALD J. MOSSINGHOFF

*Attesting Officer* *Commissioner of Patents and Trademarks*